United States Patent [19]
Sugita et al.

[11] Patent Number: 5,149,415
[45] Date of Patent: Sep. 22, 1992

[54] FILM FORMING APPARATUS

[75] Inventors: Toshio Sugita; Osamu Koseki, both of Tokyo, Japan

[73] Assignees: Department of Electrical Engineering, Science University of Tokyo; Seiko Instruments Inc., both of Japan

[21] Appl. No.: 580,641

[22] Filed: Sep. 10, 1990

[30] Foreign Application Priority Data

Sep. 27, 1989 [JP] Japan .............................. 1-113763[U]

[51] Int. Cl.⁵ .............................................. C23C 14/34
[52] U.S. Cl. ........................... 204/298.14; 204/298.11; 204/298.16
[58] Field of Search ....................... 204/298.11, 298.14, 204/298.06, 298.15, 298.02, 298.16, 192.12, 298.21

[56] References Cited
FOREIGN PATENT DOCUMENTS 61-223178 10/1986 Japan .
63-9585 2/1988 Japan .

*Primary Examiner*—Nam Nguyen
*Attorney, Agent, or Firm*—Bruce L. Adams; Van C. Wilks

[57] ABSTRACT

Herein disclosed is a film forming apparatus, in which a magnet for generating the lines of magnetic force generally at a right angle with respect to opposed cathodes is disposed at one of the cathodes to shorten the distance from a passage hole through a conduit to an object by the thickness of the magnet, thereby to pass metal particles efficiently. At the same time, a holed plate is supported elastically and in close contact with the object to form a film contouring the shape of the hole of the holed plate correctly. Moreover, the holed plate is made thinner than its diameter to permit sufficient passage of the metal particles through the hole of the holed plate thereby to form a film efficiently. In the film forming apparatus of the present invention, moreover, the magnet of the vacuum chamber at the side of the conduit of the prior art can be dispensed with to make unnecessary the drilling of the magnet and to reduce the number of parts.

4 Claims, 2 Drawing Sheets

FILM FORMING APPARATUS

BACKGROUND OF THE INVENTION

The present invention relates to an apparatus for forming a film by depositing particles produced by a cathode sputtering on an object to be coated.

FIG. 4 is a section showing a film forming apparatus according to the prior art. In FIG. 4, reference numeral 7 designates a vacuum chamber, numeral 9 designates a cylindrical anode disposed in the vacuum chamber 7, and numeral 4 designates an anode lead connected with a not-shown DC high-voltage power source. Numeral 5 designates an insulator for fixing the anode lead 4 in the vacuum chamber 7. Numerals 10a and 10b designate a pair of opposed cathodes which are disposed at the two sides of the anode 9. The opposed cathodes 10a and 10b have their faces directed at a right angle with respect to the cylindrical center line of the anode 9. Numeral 11 designates a circular passage hole which is formed in the cathode 10a. The passage hole 11 is positioned in the vicinity of that portion of the cathode 10a, which faces the end face of the anode 9. Numeral 12 designates a conduit which has its one end communicating with the inside of the vacuum chamber 7 and its center line aligned with that of the passage hole 11. At one end of the conduit 12, there is supported a holed plate 18 having a hole 19. This holed plate 18 is generally flush with the end portion of the conduit 12. Numerals 8a and 8b designate magnets which are mounted on the vacuum chamber 7. The magnet 8a is formed with a hole through which extends the conduit 12. Numeral 15 designates a vacuum sealing member which is fitted in the end portion of the conduit 12. Numeral 16 designates an exhaust pipe which is attached to the vacuum chamber 7 and connected to a not-shown evacuation apparatus. Numeral 17 designates an introduction pipe which is attached like the exhaust pipe to the vacuum chamber 7 and connected to a not-shown inert gas introduction apparatus. In the film forming apparatus thus constructed, an object 6 to be coated is held in abutment against the sealing member 15. After this, the vacuum chamber 7 is evacuated by the evacuation apparatus, and inert gases such as argon gases are introduced into the vacuum chamber 7 by the inert gas introduction apparatus to establish an inert gas atmosphere under a vacuum of $1 \times 10^{-2}$ Pa or higher in the vacuum chamber 7. After this, a high voltage is applied between the anode 9 and the cathodes 10a and 10b to cause a cold cathode discharge between the anode 9 and the cathodes 10a and 10b so that the argon atoms in the discharge space may be ionized. The positive argon ions thus produced bombard the surfaces of the cathodes 10a and 10b to sputter the substance making the cathodes 10a and 10b. Moreover, the metal particles and charged particles produced by the surface sputtering pass through the passage hole 11 and the conduit 12 until they deposit on the object 6 arranged at the end portion of the conduit 12, thus forming a film on the object outside of the vacuum chamber.

SUMMARY OF THE INVENTION

The present invention contemplates to provide an apparatus for forming a film of arbitrary shape on an object, which is placed in the atomsphere, by depositing the particles, which are produced by the cathode sputtering using a holed plate for controlling the shape of the film. The film forming apparatus is constructed by arranging only one of opposed cathodes with a magnet for generating lines of magnetic force generally at a right angle with respect to the cathodes and by supporting the holed plate elastically with respect to the object.

However, the apparatus of the prior art is required to have one magnet for exerting the lines of magnetic force perpendicularly upon each of the opposed cathodes. This large thickness of the magnets makes it necessary to elongate the conduit formed for the vacuum chamber. As a result, the rate that metal particles and ions reach the object through the passage hole and the conduit is slow which results in a long time period for depositing a film of constant thickness on the object. There arises another problem in that it is difficult to make a magnet with a hole for passing the conduit therethrough. In addition the vacuum sealing member is interposed between the object and the holed plate, resulting in a small gap corresponding to the thickness of the vacuum sealing member being formed between the object and the holed plate. As a result, the contour of the film to be formed is blurred fails to follow the hole shape of the holed plate correctly. If, on the other hand, the holed plate has a larger thickness than its hole diameter, the metal particles are more or less blocked which raises still another problem in that a sufficient film cannot be formed on the object.

DETAILED DESCRIPTION OF THE INVENTION

Figure 1:
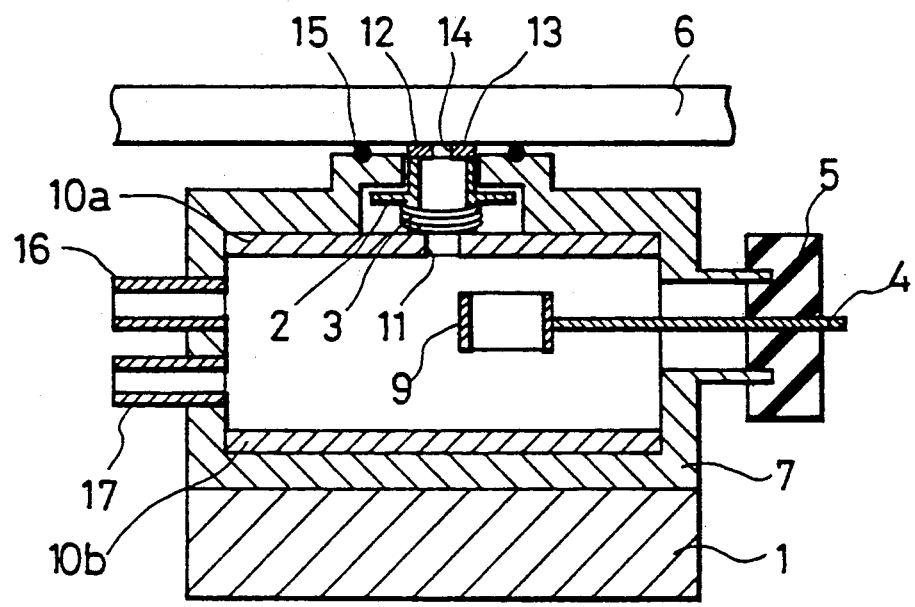
FIG. 1 is a schematic section view showing a film forming apparatus according to the present invention.

An embodiment of the present invention will be described in detail. FIG. 1 is a schematic section view showing the film forming apparatus of the present invention. In FIG. 1, reference numeral 2 designates a cylinder which fixes and supports a holed plate 13 at its leading end and which is made slidable within the conduit of a vacuum chamber 7. The cylinder 2 is urged at a right angle to an object to be coated, by the action of a spring 3 so that the holed plate 13 is elastically held in contact with the object 6. Numeral 9 designates a cylindrical anode disposed in the vacuum chamber 7, numeral 4 designates an anode lead, and numeral 5 designates an insulator. Numerals 10a and 10b designate a pair of opposed cathodes which are disposed at the two sides of the anode 9 such that their faces are at a right angle with respect to the cylindrical center line of the anode 9. Numeral 11 designates a circular passage hole which is formed in one cathode 10a. The passage hole 11 is positioned in the vicinity of that portion of the cathode 10a, which faces the end face of the anode 9. Numeral 1 designates a samarium-cobalt magnet which is disposed only at the side of the cathode that does not have the passage hole 11, with respect to the vacuum chamber 7. Numeral 15 designates a vacuum sealing member which is attached to the end portion of a conduit 12. Numeral 16 designates an evacuation pipe which is attached to the vacuum chamber 7 and connected to a not-shown evacuation apparatus. Numeral 17 designates an introduction pipe which is likewise attached to the vacuum chamber 7 and connected to a not-shown inert gas introduction apparatus.

In the film forming apparatus according to the present invention, the object 6 is held in abutment against the sealing member 15. At this time, the holed plate 13 fixed and supported at the leading end of the cylinder 2 is brought into elastic contact with the object 6 by the action of the spring. Then, the vacuum chamber 7 is evacuated to a vacuum level of $1 \times 10^{-4}$ Pa by the evacuation apparatus. After this, Ar gases are introduced into the vacuum chamber 7 from the inert gas supply apparatus to establish an Ar gas atmosphere of $2 \times 10^{-2}$ Pa in the vacuum chamber 7. When a positive potential of 1.5 KV is then applied to the anode 9 by the DC high-voltage power source, a cold cathode discharge is generated between the anode 9 and the opposed cathodes 10a and 10b made of Cr. The positive ions of Ar gases thus produced bombard the surfaces of the opposed cathodes 10a and 10b so that the sputtered particles are guided through the passage hole 11 of the cathode 10a, the conduit 12 and the hole 14 of the holed plate 13. As a result, the object 6 is formed with a film which has a shape identical to that of the hole 14 of the holed plate 13.

Figure 2A:
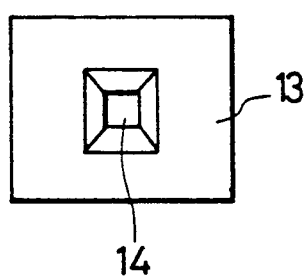
FIGS. 2(a) and 2(b) are a top plan view and a section view showing the holed plate of the present invention.

FIG. 2(a) is a top plan view of the holed plate 13; and

Figure 2B:
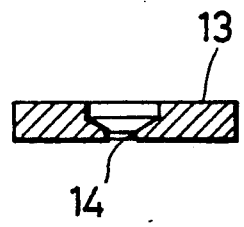

FIG. 2(b) is a cross sectional view of the holed plate 13 in the present invention.

Since the thickness of the holed plate 13 of the present invention is reduced in the periphery of the hole 14, the passage of the particles can be efficiently accomplished to form a film contouring the shape of the hole 14 correctly. On the other hand, the material of the magnet of the present invention need not be limited to that exemplified but may belong to another group such as a neodymium-iron group. In the present embodiment, moreover, the cylinder 2 is urged onto the object by the spring, 3 which may be replaced by an actuator such as an air cylinder or a piezoelectric element.

Thus, according to the present invention, the apparatus is equipped with only one magnet at the side opposite to the conduit of the vacuum chamber while eliminating the one at the side of the conduit of the vacuum chamber. Thus, the difficult process of drilling the through-hole for the conduit in a magnet is eliminated. In addition, the number of parts of the apparatus is reduced. Moreover, since the distance from the passage hole to the object can be shorter than that of the prior art by the thickness of the magnet, a film of constant thickness can be formed within a short time period because the particles can move efficiently passed through the passage hole and the conduit. Further, the particles can be more efficiently deposited on the object because the thickness of the holed plate is reduced in the vicinity of the hole. In addition, since the holed plate fixed on the cylinder is elastically urged toward the object, the contact between the holed plate and object is improved giving the effect that it is possible to form a film having the same shape as that of the hole of the holed plate.

Figure 3:
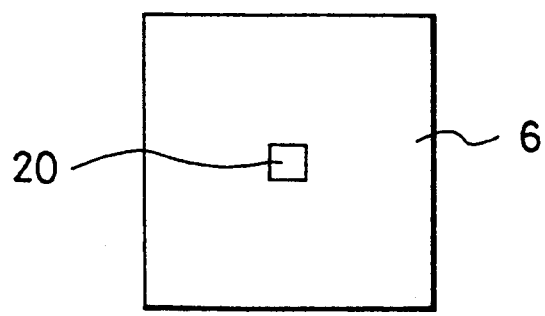
FIG. 3 is a top plan view showing the shape of a film formed on the object.
Figure 4:
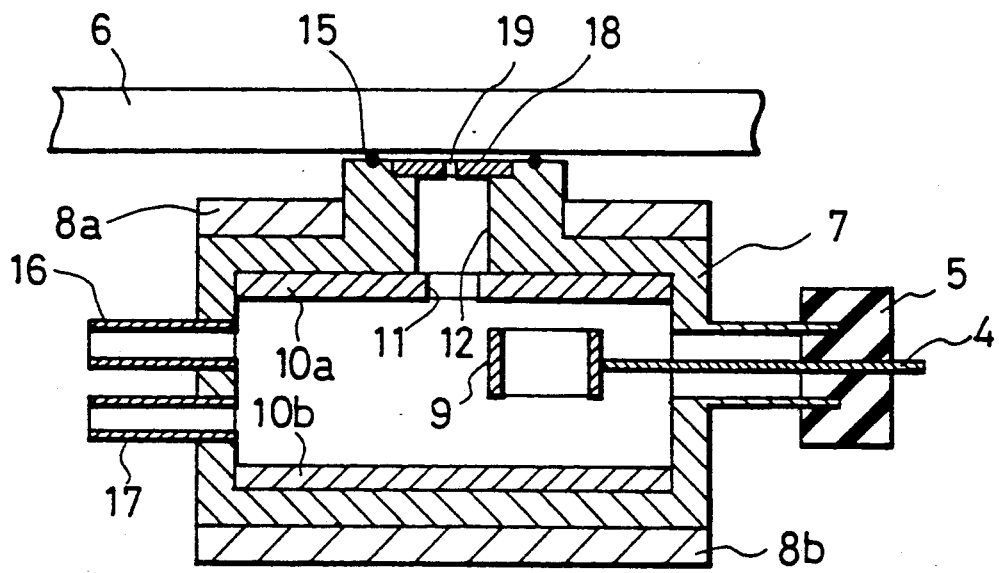
FIG. 4 is a schematic section showing the film forming apparatus of the prior art.

FIG. 3 is a plan view of the embodiment showing the film 20 formed on the object 6 by the use of the holed plate 13 in the present invention.

Figure 5A:
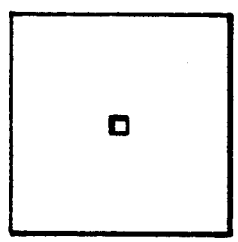
FIGS. 5(a) and 5(b) are a top plan view and a section view showing the holed plate of the prior art.
Figure 5B:
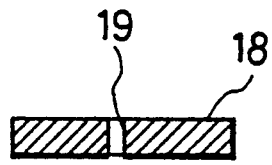

FIG. 5(a) is a plan view showing the holed plate 18 of the prior art. The holed plate 18 faces the object 6 which is supported by the end of the conduit 12 of the vacuum chamber 7. FIG. 5(b) is a cross sectional view of the holed plate 18. The hole 19 is constructed in the holed plate 18 for passing metal particles to form the film.

What is claimed is:

1. An apparatus for forming a film on an object by depositing particles produced by cathode sputtering, comprising: a vacuum chamber; a cylindrical anode disposed in said vacuum chamber; a pair of opposed cathodes disposed on two faces of the inner walls of said vacuum chamber facing said anode such as to be positioned at a right angle with respect to a cylindrical center line of said anode; a passage hole formed in one of said opposed cathodes; a holed plate having a through-hole for passing the particles and being positioned so that the through-hole faces the object, said holed plate having a tapered thickness around the periphery of said through-hole; a conduit supported by said vacuum chamber and having one end aligned with a center line of said passage hole and another end supporting the holed plate; urging means for urging the holed plate toward the object, said urging means including at least one of a spring, a piezoelectric element and an actuator in pressing contact with the conduit and not the object; and magnetic means including a magnet disposed on the other cathode not having said passage hole for exerting lines of magnetic force generally at a right angle upon said opposed electrodes, and wherein said magnetic means is positioned so as not to extend between the object and said vacuum chamber.

2. An apparatus for forming a film on an object according to claim 1; wherein the urging means comprises a spring.

3. An apparatus for forming a film on an object according to claim 1; wherein the urging means comprises a piezoelectric element.

4. An apparatus for forming a film on an object according to claim 1; wherein the urging means comprises an actuator.

* * * * *